United States Patent
Mazumder et al.

(10) Patent No.: US 6,809,970 B2
(45) Date of Patent: Oct. 26, 2004

(54) INPUT STAGE APPARATUS AND METHOD HAVING A VARIABLE REFERENCE VOLTAGE

(75) Inventors: Kallol Mazumder, Allen, TX (US); Scott Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/770,611

(22) Filed: Feb. 2, 2004

(65) Prior Publication Data

US 2004/0156222 A1 Aug. 12, 2004

Related U.S. Application Data

(60) Continuation of application No. 10/256,037, filed on Sep. 25, 2002, which is a division of application No. 09/944,936, filed on Aug. 30, 2001, now Pat. No. 6,529,422.

(51) Int. Cl.[7] ................................................ G11C 5/00
(52) U.S. Cl. ........................... 365/189.09; 365/189.02; 365/207
(58) Field of Search .................. 365/189.09, 189.02, 365/207, 205, 210, 189.01, 189.05, 230.08, 226

(56) References Cited

U.S. PATENT DOCUMENTS

| | | | |
|---|---|---|---|
| 5,742,548 A | | 4/1998 | Bahout et al. ............... 365/201 |
| 6,002,616 A | * | 12/1999 | Jeong .................... 365/189.09 |
| 6,185,145 B1 | | 2/2001 | Merritt ........................ 365/226 |
| 6,549,480 B2 | * | 4/2003 | Hosogane et al. .......... 365/226 |

* cited by examiner

Primary Examiner—David Lam
(74) Attorney, Agent, or Firm—Dorsey & Whitney LLP (57) ABSTRACT

Input stage having increased input signal noise margin and method for generating an output signal having a predetermined logic level based on the voltage level of an input signal. The input stage includes an input buffer generating an output signal having a logic level based on the voltage of the input signal relative to the voltage of the reference voltage signal. A voltage generator provides a variable output voltage signal that is used as the reference voltage by the input buffer. The voltage of the output voltage signal provided by the voltage generator is dependent on the logic value of the output signal of the input buffer. In this manner, the reference voltage applied to the input buffer can be adjusted based on the logic level of the outputs signal in order to provide increased input signal noise margin.

34 Claims, 5 Drawing Sheets

INPUT STAGE APPARATUS AND METHOD HAVING A VARIABLE REFERENCE VOLTAGE

CROSS-REFERENCE TO RELATED APPLICATION

This application is a continuation of pending U.S. patent application Ser. No. 10/256,037, filed Sep. 25, 2002, which is a divisional of U.S. patent application Ser. No. 09/944,936, filed Aug. 30, 2001, issued as U.S. Pat. No. 6,529,422 B1 on Mar. 4, 2003.

TECHNICAL FIELD

The present invention relates generally to input stages generating an output signal having a predetermined logic level based on the voltage level of an input signal, and in particular, input stages having increased input signal noise margin.

BACKGROUND OF THE INVENTION

Integrated circuits typically include a number of input/output pins which are used for communication with additional circuitry. For example, an integrated memory device such as a dynamic random access memory (DRAM) includes both control inputs for receiving memory operation control signals, and data pins for bi-directional data communication with an external system or processor. Since the information provided to an integrated circuit through its pins include both control signals and data, it is important that the signals are accurately received and interpreted by the integrated circuit for proper operation.

In addition to the need to maintain the accuracy and integrity of signals provided to an integrated circuit, as integrated circuits have become smaller, and the demand for power efficient integrated circuits increases, the voltage levels of the input and output signals have continued to be reduced. Input and output signals having lower voltage swings have the benefit of lower switching times and lower power consumption. New circuitry and methods have been developed to accommodate the lower voltage levels while ensuring the accuracy and integrity of the data provided by the signals. For example, input stages generally provide an output signal having a defined logic level based on the voltage level of an input signal. Input stages have traditionally set the voltage levels at which the input signal causes either a logic HIGH or LOW output signal to be generated by designing input transistors having the appropriate sizes. However, to accommodate the reduced voltage levels of the input signals, alternative methods and input stage designs have been developed.

Figure 1:
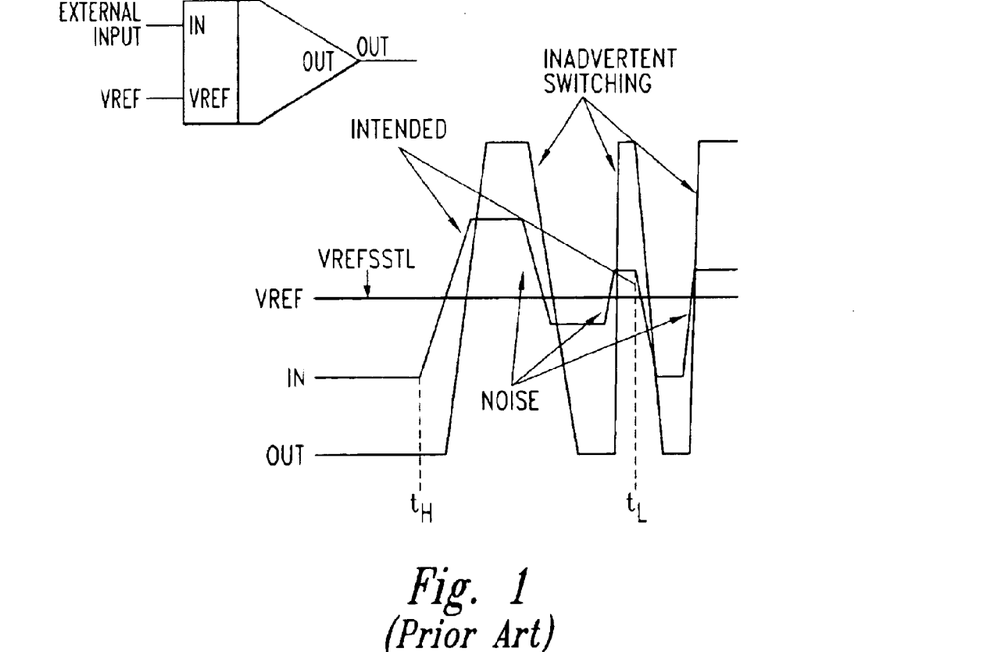
FIG. 1 is a signal diagram illustrating various signals of a conventional input buffer.

One such input stage includes an input buffer that generates an output signal having a logic level based on the voltage level of an input signal relative to a reference voltage VREF. That is, where the input signal has a voltage level greater than the VREF voltage, the input buffer generates a HIGH output signal, and where the voltage level is less than the VREF voltage, a LOW output signal is generated. However, an issue with input signal noise margin may arise with these conventional input stages. As illustrated in FIG. 1, where a constant reference voltage VREF is applied, it is possible to have inadvertent switching of an input buffer due to a noisy system bus. The reference voltage VREF is maintained at a steady voltage level VREFSSTL. When the IN signal crosses VREFSSTL due to noise, the input buffer switches the logic level of the output signal OUT. Thus, although the IN signal is intended to transition once from a relatively low voltage level to a relatively high voltage level at a time $t_H$, and then once again back to a relatively low voltage at a time $t_L$, the OUT signal switches logic levels a total of five times due to the noise of the IN signal.

Although system designers have attempted to reduce noise on system busses, and device designers have attempted to reduce susceptibility to input signal noise, the issue is nevertheless becoming more significant as the voltage levels of input signals continue to decrease. Therefore, there is a need for an input stage having improved input signal noise margin and having less susceptibility to inadvertent switching due to the input signal noise.

SUMMARY OF THE INVENTION

The present invention is directed to an input stage and method having increased input signal noise margin for generating an output signal having a predetermined logic level in response to receiving an input signal having a voltage level. The input stage includes an input buffer that includes an input to which the input signal is applied and an output at which the output signal is provided. The input buffer also includes a reference terminal to which a reference voltage signal is applied. The input buffer generates an output signal having a logic level based on the voltage of the input signal relative to the voltage of the reference voltage signal applied to the reference terminal. The input stage further includes a voltage generator that generates a variable output voltage signal that is used as the reference voltage for the input buffer. The voltage of the output voltage signal provided by the voltage generator is dependent on the logic value of the output signal of the input buffer. In this manner, the reference voltage applied to the input buffer can be adjusted based on the logic level of the output signal in order to provide increased input signal noise margin.

DETAILED DESCRIPTION OF THE INVENTION

Embodiments of the present invention are directed to an input stage having input buffer circuitry using a variable reference voltage to improve input signal noise margin. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
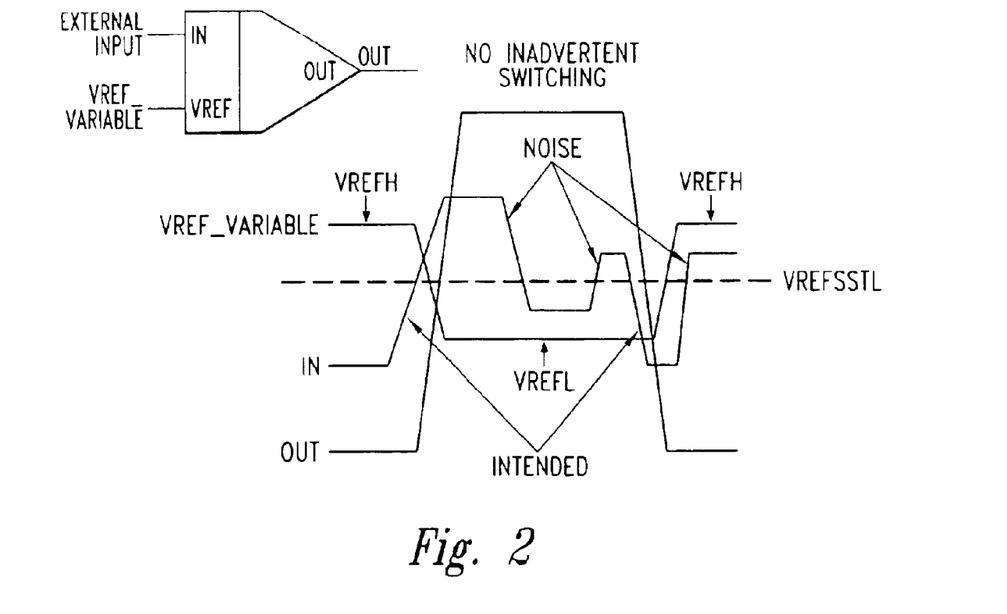
FIG. 2 is a signal diagram illustrating various signals of an input stage according to an embodiment of the present invention.

FIG. 2 is a signal diagram illustrating various signals of an input stage according to embodiments of the present invention. It will be appreciated that FIG. 2 is not drawn to scale. As with FIG. 1, which illustrated various signals of the prior art input buffer circuitry, FIG. 2 illustrates an input signal IN to the input stage, an output signal OUT provided by the input stage in response to the IN signal, and a reference voltage VREF. However, in contrast to FIG. 1, the VREF voltage illustrated in FIG. 2 is variable. That is, the VREF voltage changes in accordance with the logic level of the OUT signal. The VREFSSTL voltage is also shown in FIG. 2 for the purposes of comparison. As shown in FIG. 2, two different voltage levels are used for VREF, a high reference voltage VREFH, which is used for determining when to generate an OUT signal having a HIGH logic level in response to a HIGH IN signal, and a low reference voltage VREFL, which is used for determining when to generate an OUT signal having a LOW logic level in response to a LOW IN signal. In contrast to FIG. 1, the OUT signal illustrated in FIG. 2 does not fluctuate in response to the noise of the IN signal because of the increased noise margin provided by the use of a variable reference voltage.

Figure 3:
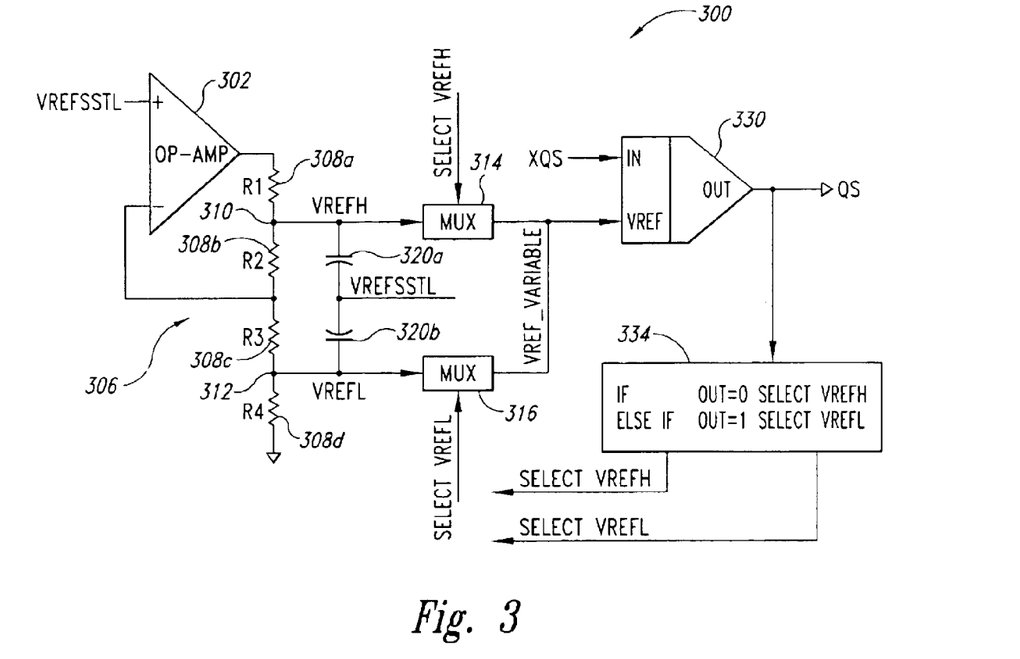
FIG. 3 is a functional block diagram illustrating an input stage according to another embodiment of the present invention.

FIG. 3 illustrates a series-stub-terminated logic (SSTL) input stage 300 according to embodiments of the present invention. A constant reference voltage VREFSSTL is applied to a non-inverting input of an operational amplifier 302, as known in the art. A resistive voltage divider circuit 306, which includes resistors 308a–308d, is coupled to the output of the op-amp 302. The voltage at a node between the second and third resistors 308b and 308c, respectively, is provided back to the inverting input of the op-amp 302. As a result, the op-am 302 will generate an output signal having a voltage such that the voltage provided back to the inverting input is approximately equal to VREFSSTL. Consequently, the voltage at the output of the op-amp 302 is greater than the VREFSSTL voltage. As shown in FIG. 3, a high reference voltage VREFH is generated at a node 310 located between the first and second resistors 308a and 308b, respectively, and is provided to a multiplexer 314. A low reference voltage VREFL is also generated at a node 312 located between the third and fourth resistors 308c and 308d, respectively, and is provided to a multiplexer 316. Both multiplexers 314 and 316 can be of conventional design known in the art. As mentioned previously, the VREFH voltage is relatively higher than the VREFSSTL voltage, and the VREFL voltage is relatively lower than the VREFSSTL voltage. It will be appreciated that the VREFH and VREFL voltages can be adjusted relative to one another by changing the relative resistance values of the resistors 308a–308d. In an embodiment of the input stage 300, one or more of the resistors 308a–308d consists of a variable resistor, as well known in the art, to allow for the VREFH and VREFL voltages to be adjusted.

The VREFSSTL voltage is also applied to a terminal of a capacitor 320a that is coupled to the node 310 and a terminal of a capacitor 320b that is coupled to the node 312 in order to respond to fluctuations in the VREFSSTL voltage. That is, by coupling the VREFSSTL voltage to nodes 310 and 312 through capacitors 320a and 320b, respectively, the voltage at the respective nodes will maintain the relative relationship with the VREFSSTL voltage. Thus, the voltages of VREFH and VREFL with respect to the VREFSSTL voltage will be held relatively constant. The capacitors 320a and 320b additionally smooth fluctuations in the VREFH and VREFL voltages.

The multiplexer 314 provides the VREFH voltage to a VREF input of an SSTL input buffer 330 in response to an active selection signal SELECT VREFH. Similarly, the multiplexer 316 provides the VREFL voltage to the VREF input of the SSTL input buffer 330 in response to an active selection signal SELECT VREFL. An external input signal XQS is applied to an IN input of the input buffer 330. The input buffer 330, which can be of a conventional design known in the art, compares the voltage of the input signal to the reference voltage applied to the VREF input, and generates an output signal having an appropriate logic level at an output terminal. The output value QS generated by the input buffer 330 is also provided to a selection circuit 334 for generating the SELECT VREFH and SELECT VREFL signals for the multiplexers 314 and 316. As will be explained in more detail below, the selection circuit 334 provides an active selection signal to the appropriate multiplexer in response to the logic level of the QS signal. Consequently, the reference voltage applied to the VREF input to the input buffer 330 will be selected based on the logic level of the output signal.

As will be explained in greater detail below, embodiments of the present invention use a variable voltage as the reference voltage for the input buffer 330, the voltage of which is a function of the logic state of the input buffer. More specifically, if the output signal of the input buffer 330 has a HIGH logic level, then a reference voltage having the VREFL voltage, where VREFL<VREFSSTL, is provided to the input buffer 330 as VREF. Where the output signal of the input buffer 330 is a LOW logic level, then a reference voltage having the VREFH voltage, where VREFH>VREFSSTL, is provided to the input buffer 330 as VREF. With this arrangement, the input stage will not switch as soon as the input crosses VREFSSTL. Once the input stage generates a HIGH logic level, the reference voltage switches, and the voltage of the input signal will need to be lower than VREFL for a LOW output signal to be generated. Once the input stage generates a LOW logic level, the reference voltage switches, and the voltage of the input signal will need to be greater than VREFH for a HIGH output signal to be generated. In effect, input stages according to embodiments of the present invention have a built in hysteresis by using a variable VREF, consequently, resulting in improved noise immunity.

Figure 4:
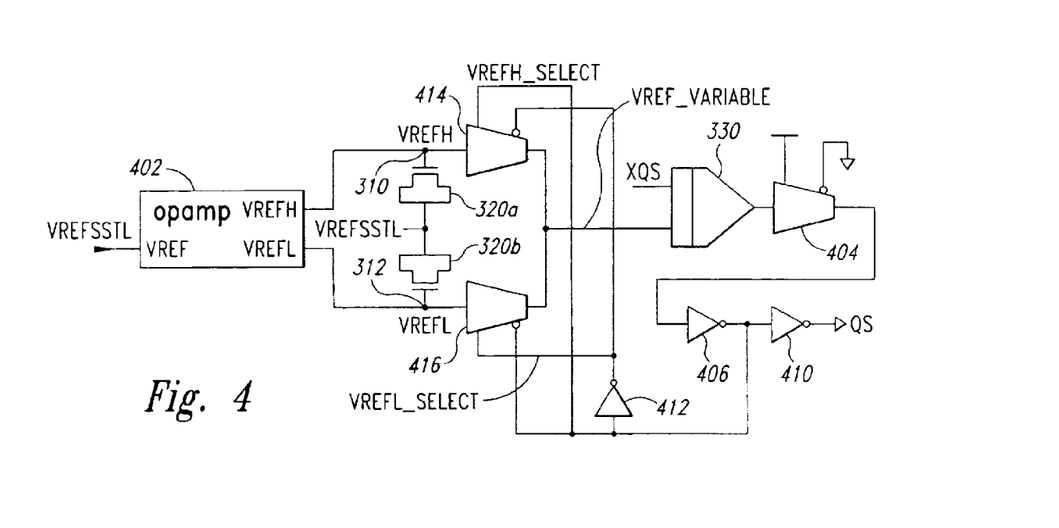
FIG. 4 is a functional block diagram of an input stage according to an embodiment of the present invention.

FIG. 4 is a schematic drawing of a portion of the input stage 300 illustrated in FIG. 3. Operational amplifier block 402 represents the op-amp 302 and the voltage divider circuit 306 (FIG. 3). Transfer gates 414 and 416 represent the multiplexers 314 and 316, respectively. As illustrated in FIG. 4, coupled to the output of the input buffer 330 are a transfer gate 404 and a pair of inverters 406 and 410. The control terminals of the transfer gate 404 are tied to a respective reference voltage to couple the output of the input buffer 330 to the input of an inverter 406. The output of the inverter 406 and an inverter 412 are provided to control terminals of the transfer gates 414 and 416 to select between the VREFH and VREFL as the VREF input of the input buffer 330. Specifically, where the output signal of the input buffer 330 has a HIGH logic level, the transfer gate 416 is activated to couple the node 312 to the VREF input to provide the VREFL voltage as the reference voltage, and where the output signal of the input buffer 330 has a LOW logic level, the transfer gate 414 is activated to couple the node 310 to the VREF input to provide the VREFH voltage.

Figure 5A:
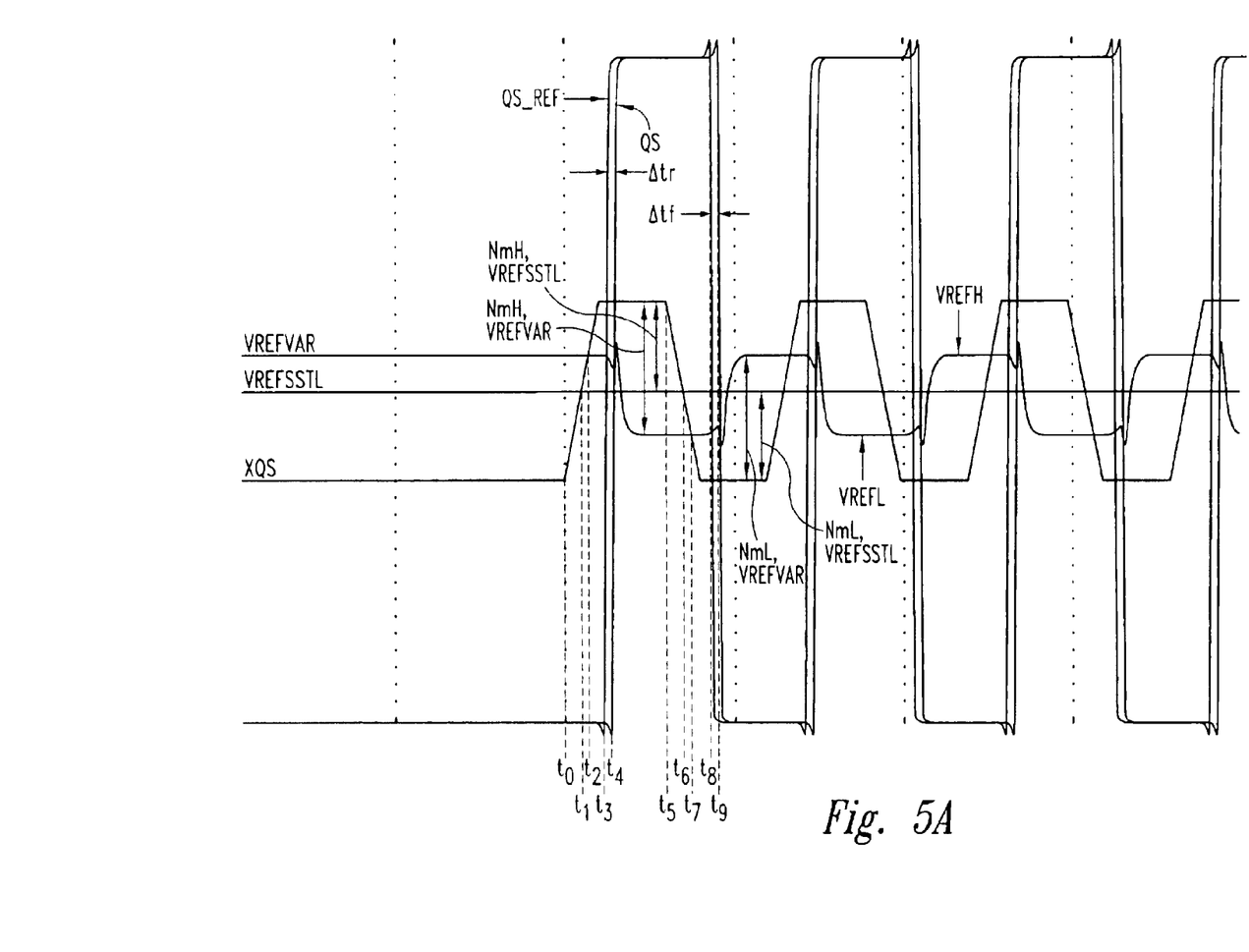
FIGS. 5a and 5b are signal diagrams showing various signals of an input stage according to an embodiment of the present invention.

Operation of the input stage 300 will be described with respect to FIGS. 5a and 5b. FIG. 5a illustrates the output signal QS in response to an input signal XQS. The signal applied to the VREF input of the input buffer 330 (FIG. 3) is represented by the signal VREFVAR. For the purposes of comparison, FIG. 5a also illustrates the output signal QS_REF generated by an input buffer having a constant reference voltage applied to its VREF input. The constant reference voltage is represented in FIG. 5a as VREFSSTL.

At a time $t_0$, the XQS signal makes a transition from a relatively low voltage level to a relatively high voltage level. With respect to the receiving a constant VREFSSTL reference signal, at a time $t_1$ the XQS signal exceeds the VREFSSTL voltage level, and as a result, the output signal QS_REF switches to a HIGH logic level at a time $t_3$. For the input buffer 330 having the VREFVAR signal applied to its VREF input, the XQS signal exceeds the VREFVAR signal at a time $t_2$, which in turn causes the input buffer 330 to output a HIGH QS signal at a time $t_4$. As previously discussed, in response to the QS signal going HIGH, the VREFVAR signal falls to a VREFL voltage level shortly after time $t_4$ in order to provide improves noise margin with respect to the XQS signal.

At a time $t_5$, the XQS signal makes a transition from a relatively high voltage level to a relatively low voltage level. The voltage of the XQS signal falls below the VREFSSTL voltage level at a time $t_6$, and in response the QS_REF signal switches from a HIGH logic level to a LOW logic level at a time $t_8$. At a time $t_7$, the voltage of the XQS signal falls below the VREFL voltage, causing the input buffer 330 to force the QS signal from HIGH to LOW at a time $t_9$. In response to the transition in the QS signal, the VREFVAR signal switches from the VREFL voltage to a VREFH voltage to provide increased noise margin for the XQS signal.

As illustrated by FIG. 5a, the input buffer 330 which receives a variable reference voltage applied to its VREF input produces the same output as the conventional input buffer using a constant reference voltage, but provides improved noise margin for the input signal XQS. The noise margin for the input buffer with a variable reference voltage is represented in FIG. 5a as $N_{mH,VREFVAR}$ and $N_{mL,VREFAR}$. Compared with the noise margin for the input buffer with the constant reference voltage, that is, $N_{mH,VREFSSTL}$ and $N_{mL,VREFSSTL}$, the noise margins of $N_{mH,VREFVAR}$ and $N_{mL,VREFVAR}$ are clearly greater. It will appreciated that although the difference in the voltage values of VREFL and VREFH relative to the VREFSSTL signal are illustrated in FIG. 5a as being approximately equal, the voltages of VREFL and VREFH may be tailored, as previously described, such that the differences are unequal if so desired. That is, the VREFL and VREFH voltage levels can be controlled independently to meet specific design requirements.

A time delay $\Delta t_r$ and $\Delta t_f$ between the output signals of the input buffer receiving the constant reference voltage VREFVAR, and the input buffer stage receiving the variable reference voltage VREFSSTL. The time delays $\Delta t_r$ and $\Delta t_f$ result from the difference in the reference voltage applied to an input buffer. That is, it takes more time for an input signal to exceed the threshold for the variable reference voltage, either VREFL or VREFH, than for the constant reference voltage VREFSSTL. The time delay will be affected by the slew rate of the input signal XQS. It will be appreciated that the time delays are minimal and the additional noise margin afforded by the variable reference voltage is a benefit that may outweigh any adverse affect on device performance.

Figure 5B:
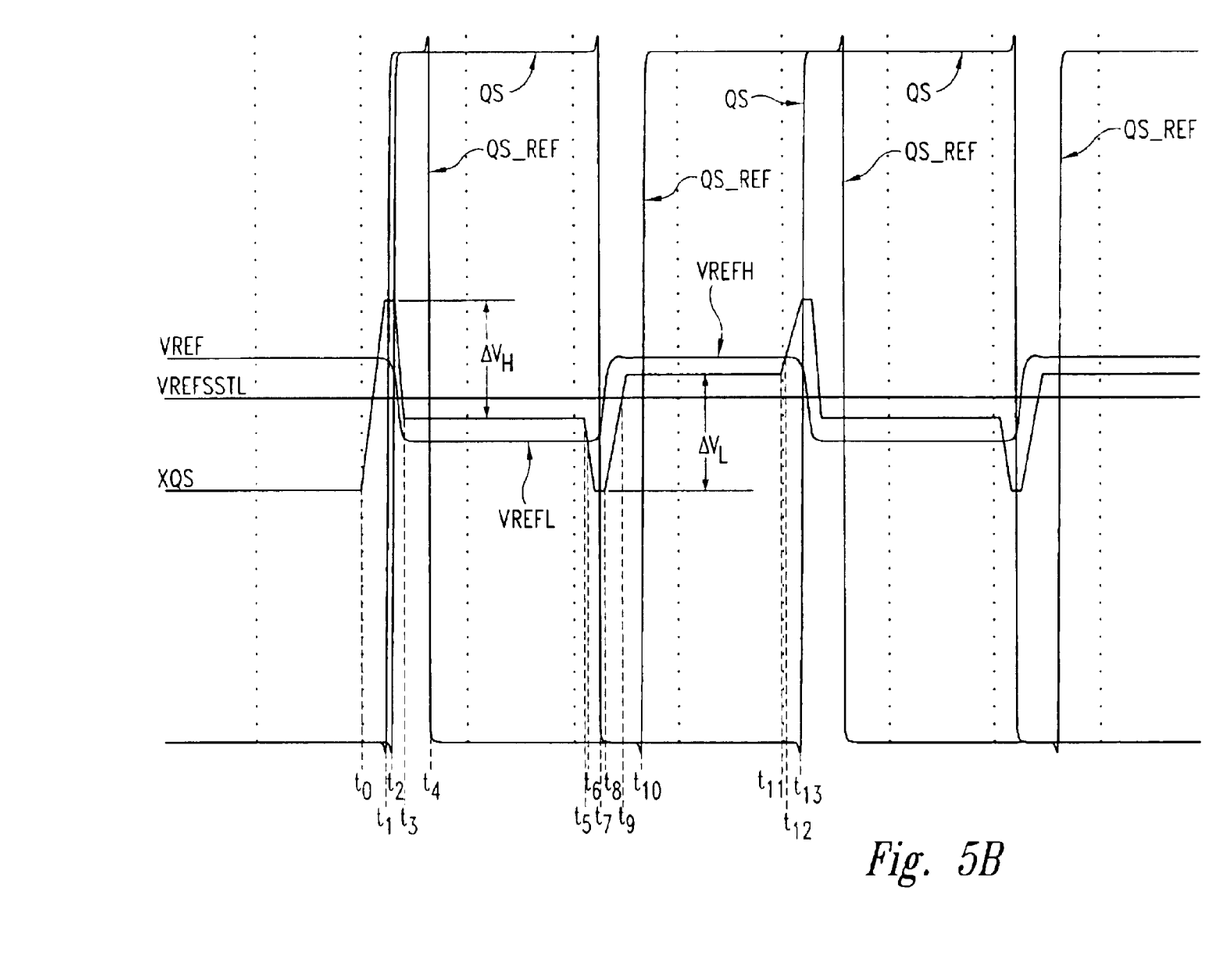

FIG. 5b illustrates the advantage provided by embodiments of the present invention over conventional input stages. In FIG. 5b, the input signal XQS simulates a "noisy" input signal. That is, at a time $t_0$, the XQS signal makes a transition from a relatively low voltage level to a relatively high voltage level. Input signal noise is simulated by decreasing the voltage of the XQS signal $\Delta V_H$ at a time $t_2$. The voltage level is maintained until a time $t_5$, at which time the XQS signal makes a transition to a relatively low voltage level. At a time $t_8$, input signal noise is simulated by increasing the voltage of the XQS signal $\Delta V_L$. The noise level is maintained until a time $t_{11}$, where the XQS signal makes a transition back to a relatively high voltage level.

With respect to the output signals, QS_REF represents the output signal of an input buffer receiving a constant reference voltage VREFSSTL, and QS represents the output signal of an input buffer receiving a variable reference voltage VREF. Approximately at a time $t_1$, QS_REF and QS make a transition to a HIGH logic level in response to the XQS signal exceeding the voltages VREFSSTL and VREF, respectively. The transition to the HIGH logic level of the QS signal causes the VREFVAR signal to change to a VREFL voltage, which as a result, increases input signal noise margin. As mentioned previously, input signal noise is simulated at a time $t_2$ by decreasing the voltage of the XQS signal $\Delta V_H$. The change in the voltage $\Delta V_H$ results in the XQS signal dropping below the VREFSSTL voltage at a time $t_3$. In response, the QS_REF signal makes a transition to a LOW logic level at a time $t_4$, although the change in voltage $\Delta V_H$ merely represents input signal noise. In contrast, because the variable reference voltage VREFVAR is set to the VREFL voltage, providing increased noise margin, the QS signal is unaffected by the introduction of noise to the XQS signal at a time $t_2$. The QS signal does not transition to a LOW logic level until a time $t_7$, which is in response to switching to a relatively low voltage level at time $t_5$ and the voltage of the XQS signal exceeding the VREFL voltage at a time $t_6$. As illustrated by the present example, the use of a variable reference voltage VREFVAR as the reference voltage for an input buffer can provide additional input noise margin that reduces susceptibility to inadvertent switching due to input signal noise.

Following the transition of the QS signal at time $t_7$ from a HIGH logic level to a LOW logic level, the VREFVAR voltage is adjusted to the VREFH voltage to provide additional noise margin for the XQS signal. As previously described, at a time $t_8$, the voltage of the XQS is increased by a $\Delta V_L$ voltage to simulate input signal noise, although the change in voltage $\Delta V_L$ merely represents input signal noise. The resulting XQS signal exceeds the constant reference voltage VREFSSTL at a time $t_9$, and consequently, the QS_REF signal makes a transition from a LOW logic level to a HIGH logic level at a time $t_{10}$. The QS signal, on the other hand, remains at the LOW logic level despite the input noise $\Delta V_L$, and does not make a transition to a HIGH logic level until a time $t_{13}$, which is in response to the XQS signal making a transition at a time $t_{11}$ and having a voltage exceeding the VREFH voltage at a time $t_{12}$. As with the previous example where noise was simulated for an input signal having a HIGH logic level, the QS signal was resistant to fluctuations for a LOW XQS signal having a noise of $\Delta V_L$.

The present example more clearly demonstrates the advantages provided by using a variable reference voltage as the reference voltage for an input driver in order to provide increased input noise margin.

Figure 6:
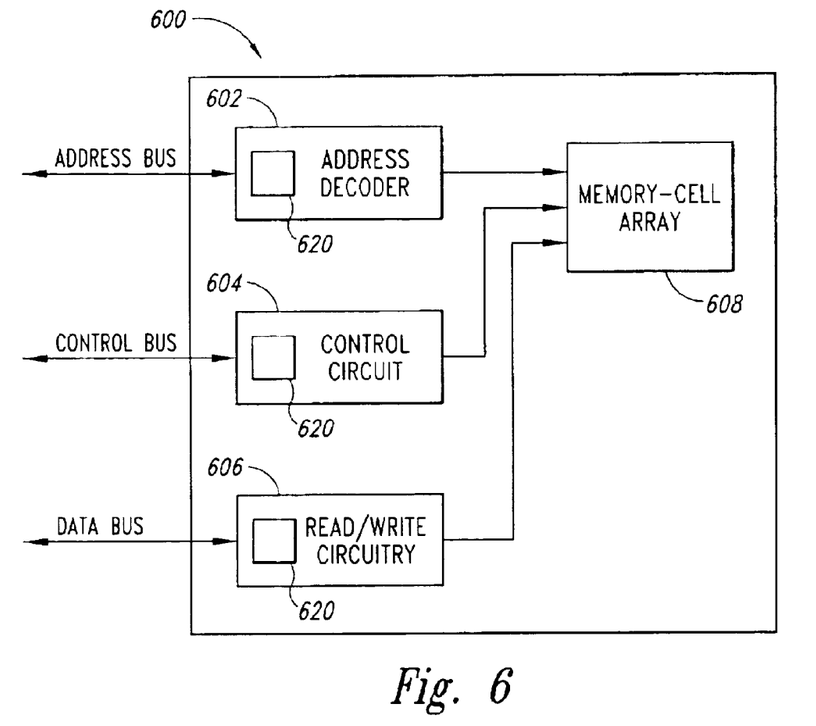
FIG. 6 is a block diagram of a memory device including an input stage according to an embodiment of the present invention.

FIG. 6 is a block diagram of a dynamic random access memory ("DRAM") 600 that includes an address decoder 602, control circuit 604, and read/write circuitry 606. The address decoder 602, control circuit 604, and read/write circuitry 606 are all coupled to a memory-cell array 608. In addition, the address decoder 602 is coupled to an address bus, the control circuit 604 is coupled to a control bus, and the read/write circuit 606 is coupled to a data bus. In operation, external circuitry, such as a processor or memory controller, applies address, data, and control signals on the respective busses to transfer data to and from the DRAM 600. As illustrated in FIG. 6, input stages 620 according to embodiments of the present invention are included in the address decoder 602, the control circuit 604, and the read/write circuitry 606. The input stages 620 receive input signals and, based on the voltage levels of the input signals, generate output signals having the appropriate logic levels for the respective circuitry. It will be appreciated that although FIG. 6 shows an input stage 620 included in the address decoder 602, the control circuit 604, and the read/write circuitry 606, the input stage 620 can be included in greater or fewer of the functional circuit blocks without deviating from the scope of the present invention. Moreover, the input stage 620 could also be included in other memory cell circuit blocks that are well known, where inclusion of an input stage is appropriate.

Figure 7:
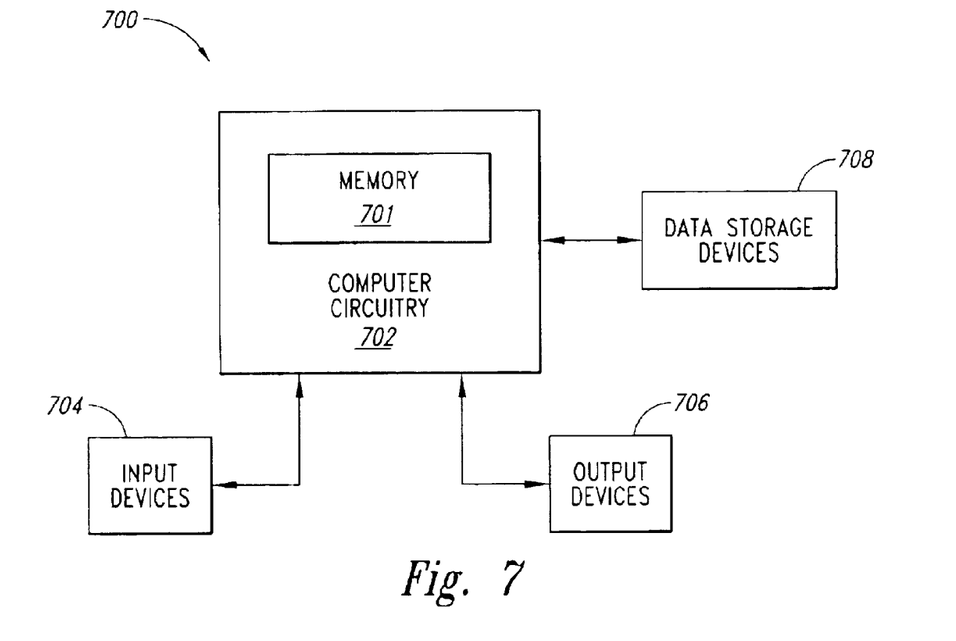
FIG. 7 is a block diagram of a computer system including a memory device of FIG. 6.

FIG. 7 is a block diagram of a computer system 700 including computing circuitry 702. The computing circuitry 702 contains a memory 701 that includes input stage circuitry according to embodiments of the present invention. The computing circuitry 702 performs various computing functions, such as executing specific software to perform specific calculations or tasks. In addition, the computer system 700 includes one or more input devices 704, such as a keyboard or a mouse, coupled to the computer circuitry 702 to allow an operator to interface with the computer system. Typically, the computer system 700 also includes one or more output devices 706 coupled to the computer circuitry 702, such output devices typically being a printer or a video terminal. One or more data storage devices 708 are also typically coupled to the computer circuitry 702 to store data or retrieve data from external storage media (not shown). Examples of typical storage devices 708 include hard and floppy disks, tape cassettes, and compact disc read-only memories (CD-ROMs). The computer circuitry 702 is typically coupled to the memory device 701 through appropriate address, data, and control busses to provide for writing data to and reading data from the memory device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An input stage for generating an output signal having a voltage level according to the voltage level of an input signal relative to a reference voltage level, the input stage comprising:

an input buffer circuit having an input node at which the input signal is applied, a reference node at which a reference voltage signal having the reference voltage level is applied, and an output node at which the output signal is provided;

an amplifier circuit having an input node to which a standard reference voltage signal is applied, a first output node at which a first reference voltage signal generated by the amplifier circuit and having a first voltage level greater than the standard reference voltage signal is provided, and further having a second output node at which a second reference voltage signal generated by the amplifier circuit and having a second voltage level less than the standard reference voltage signal is provided; and a multiplexer having a selection terminal coupled to the output node of the input buffer, an output coupled to the reference node, and first and second input terminals coupled to the first and second output nodes of the amplifier, respectively, the multiplexer coupling the first reference voltage signal to the reference node in response to the output signal of the input buffer having a low logic level and coupling the second reference voltage signal to the reference node in response to the output signal of the input buffer having a high logic level.

2. The input stage of claim 1 wherein the amplifier circuit comprises:

a differential amplifier having a first input at which the input signal is applied, a second input and an output; and a voltage divider circuit having an input, a first node, a second node and a third node at which different voltage levels are coupled, the input node of the voltage divider circuit coupled to the output of the differential amplifier, the first node coupled to the first input terminal of the multiplexer, the second node coupled to the second input of the differential amplifier, and the third node coupled to the second input terminal of the multiplexer.

3. The input stage of claim 2 wherein the voltage divider circuit comprises:

a first resistor coupled between the input and the first node;

a second resistor coupled between the first node and the second node;

a third resistor coupled between the second node and third node; and a fourth resistor coupled between the third node and ground.

4. The input stage of claim 1, further comprising:

a first capacitor having a first node coupled to the first output node of the amplifier circuit and a second node to which the reference voltage signal is applied; and a second capacitor having a first node coupled to the second output node of the amplifier circuit and a second node coupled to the second node of the first capacitor.

5. The input stage of claim 1 wherein the multiplexer comprises:

a first transfer gate having an input coupled to the first output node of the amplifier circuit and an output coupled to the input node of the input buffer, the first transfer gate having a control terminal coupled to the output node of the input buffer; and a second transfer gate having an input coupled to the second output node of the amplifier circuit and an output coupled to the input node of the input buffer, the second transfer gate having a control terminal coupled to the output node off the input buffer.

6. An input stage, comprising:

a differential amplifier having first and second input nodes and an output node, a standard reference signal having a standard reference voltage applied to the first input node;

first, second, third, and fourth series coupled resistors having a first node between the first and second resistors, a second node between the second and third resistors and a third node between the third and fourth resistors, the series coupled resistors coupled between the output node of the differential amplifier and ground, the second node coupled to the second input node of the differential amplifier;

an input buffer circuit having an input node, a reference node and an output node, the input buffer generating an output signal having a voltage level according to the voltage level of an input signal applied to the first input node relative to the voltage level of a reference signal applied to the reference node;

a first switch coupled to the first node of the series coupled resistors and the reference node and having a control node coupled to the output of the input buffer, the first switch coupling the first node and the reference node together in response to an output signal having a voltage level less than the standard reference signal; and a second switch coupled to the third node of the series coupled resistors and the reference node and having a control node coupled to the output of the input buffer, the second switch coupling the third node and the reference node together in response to an output signal having a voltage level greater than the standard reference signal.

7. The input stage of claim 6 wherein the first switch comprises a first transfer gate and the second switch comprises a second transfer gate.

8. The input stage of claim 6 wherein the first and second switches are included in a multiplexer.

9. The input stage of claim 6, further comprising:

a first capacitor having a first node coupled to the first node of the series coupled resistors and a second node to which the standard reference signal is applied; and a second capacitor having a first node coupled to the third node of the series coupled resistors and a second node coupled to the second node of the first capacitor.

10. The input stage of claim 6 wherein the input buffer comprises a SSTL input buffer.

11. A memory device, comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage for providing an output signal having a logic value based on the voltage of an input signal, the input stage comprising:

an input buffer having an input terminal to which the input signal is applied, an output terminal at which the output signal is provided, and a reference terminal to which a reference voltage signal is applied, the input buffer generating an output signal having a logic value based on the voltage of the input signal relative to the voltage of the reference voltage signal;

an operational amplifier having a first input at which an initial reference voltage is applied, a second input, and an output;

a voltage divider circuit coupled between the output of the operational amplifier and a reference voltage supply, the voltage divider circuit having a first node at which a high reference voltage is provided, a second node coupled to the second input of the operational amplifier, and a third node at which a low reference voltage is provided; and first and second transfer gates coupled to the first and second nodes of the voltage divider, respectively, each transfer gate having control terminals to which the output of the input buffer is coupled, the first transfer gate coupling the high reference voltage signal to the reference terminal in response to the output signal of the input buffer having a low logic value and the second transfer gate coupling the low reference voltage signal to the reference terminal in response to the output signal of the input buffer having a high logic value.

12. The memory device of claim 11 wherein the input stage further comprises a first capacitor having a first terminal coupled to the first node and a second capacitor having a first terminal coupled to the third node, the first and second capacitors each having a second terminal to which the initial reference voltage signal is applied.

13. The memory device of claim 11 wherein the voltage divider of the input stage comprises:

a first resistor electrically coupled between the output of the operational amplifier and the first node;

a second resistor electrically coupled between the first node and the second node;

a third resistor electrically coupled between the second node and the third node; and a fourth resistor electrically coupled between the third node and the reference voltage supply.

14. The memory device of claim 11 wherein the input stage further comprises first and second transfer gates coupled to the first and second output terminals of the amplifier, respectively, each transfer gate having control terminals to which the output of the input buffer is coupled, the first transfer gate coupling the high reference voltage signal to the reference terminal in response to the output signal of the input buffer having a low logic value and the second transfer gate coupling the low reference voltage signal to the reference terminal in response to the output signal of the input buffer having a high logic value.

15. A memory device, comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage including an SSTL input buffer having input signal terminal, an output terminal and a reference voltage terminal, the input stage comprising:

an amplifier having an input to which a initial reference voltage signal is applied and further having first and second output terminals, the amplifier generating from the initial reference voltage signal a high reference voltage signal at the first output terminal and a low reference voltage signal at the second output terminal; and a selection circuit having first and second input terminals coupled to the first and second output terminals of the amplifier, respectively, an output terminal coupled to the reference voltage terminal, and a control terminal coupled to the output terminal of the input buffer, the selection circuit selectively coupling the first and second input terminals to the output terminal based on a logic value of an output signal of the input buffer to provide either the high or low reference voltage signals to the input buffer as the reference voltage signal.

16. The memory device of claim 15 wherein the amplifier of the input stage comprises:

an operational amplifier having a first input at which the initial reference voltage is applied, a second input, and an output at which an output signal is provided; and a voltage divider circuit coupled between the output of the operational amplifier and a reference voltage supply, the voltage divider circuit having a first node at which the high reference voltage signal is provided, a second node coupled to the second input of the operational amplifier, and a third node at which the low reference voltage signal is provided.

17. The memory device of claim 16 wherein the voltage divider of the input stage comprises:

a first resistor electrically coupled between the output of the operational amplifier and the first node;

a second resistor electrically coupled between the first node and the second node;

a third resistor electrically coupled between the second node and the third node; and a fourth resistor electrically coupled between the third node and the reference voltage supply.

18. The memory device of claim 15 wherein the selection circuit of the input stage comprises a multiplexer having a selection terminal coupled to the output terminal of the input buffer, an output coupled to the reference terminal, and first and second input terminals coupled to the first and second output terminals of the amplifier, respectively, the multiplexer providing the high reference voltage signal as the reference voltage signal in response to the output signal of the input buffer having a low logic value and the low reference voltage signal as the reference voltage signal in response to the output signal of the input buffer having a high logic value.

19. The memory device of claim 15 wherein the selection circuit of the input stage comprises first and second transfer gates coupled to the first and second output terminals of the amplifier, respectively, each transfer gate having control terminals to which the output of the input buffer is coupled, the first transfer gate coupling the high reference voltage signal to the reference terminal in response to the output signal of the input buffer having a low logic value and the second transfer gate coupling the low reference voltage signal to the reference terminal in response to the output signal of the input buffer having a high logic value.

20. The memory device of claim 15 wherein the input stage further comprises a first capacitor having a first terminal coupled to the first node and a second capacitor having a first terminal coupled to the third node, the first and second capacitors each having a second terminal to which the initial reference voltage signal is applied.

21. A memory device, comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage for generating an output signal having a voltage level according to the voltage level of an input signal relative to a reference voltage level, the input stage comprising:

an input buffer circuit having an input node at which the input signal is applied, a reference node at which a reference voltage signal having the reference voltage level is applied, and an output node at which the output signal is provided;

an amplifier circuit having an input node to which a standard reference voltage signal is applied, a first output node at which a first reference voltage signal generated by the amplifier circuit and having a first voltage level greater than the standard reference voltage signal is provided, and further having a second output node at which a second reference voltage signal generated by the amplifier circuit and having a second voltage level less than the standard reference voltage signal is provided; and a multiplexer having a selection terminal coupled to the output node of the input buffer, an output coupled to the reference node, and first and second input terminals coupled to the first and second output nodes of the amplifier, respectively, the multiplexer coupling the first reference voltage signal to the reference node in response to the output signal of the input buffer having a low logic level and coupling the second reference voltage signal to the reference node in response to the output signal of the input buffer having a high logic level.

22. The memory device of claim 21 wherein the amplifier circuit of the input stage comprises:

a differential amplifier having a first input at which the input signal is applied, a second input and an output; and a voltage divider circuit having an input, a first node, a second node and a third node at which different voltage levels are coupled, the input node of the voltage divider circuit coupled to the output of the differential amplifier, the first node coupled to the first input terminal of the multiplexer, the second node coupled to the second input of the differential amplifier, and the third node coupled to the second input terminal of the multiplexer.

23. The memory device of claim 22 wherein the voltage divider circuit of the input stage comprises:

a first resistor coupled between the input and the first node;

a second resistor coupled between the first node and the second node;

a third resistor coupled between the second node and third node; and a fourth resistor coupled between the third node and ground.

24. The memory device of claim 21 wherein the input stage further comprises:

a first capacitor having a first node coupled to the first output node of the amplifier circuit and a second node to which the reference voltage signal is applied; and a second capacitor having a first node coupled to the second output node of the amplifier circuit and a second node coupled to the second node of the first capacitor.

25. The memory device of claim 21 wherein the multiplexer of the input stage comprises:

a first transfer gate having an input coupled to the first output node of the amplifier circuit and an output coupled to the input node of the input buffer, the first transfer gate having a control terminal coupled to the output node of the input buffer; and a second transfer gate having an input coupled to the second output node of the amplifier circuit and an output coupled to the input node of the input buffer, the second transfer gate having a control terminal coupled to the output node off the input buffer.

26. A memory device, comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage, comprising:

a differential amplifier having first and second input nodes and an output node, a standard reference signal having a standard reference voltage applied to the first input node;

first, second, third, and fourth series coupled resistors having a first node between the first and second resistors, a second node between the second and third resistors and a third node between the third and fourth resistors, the series coupled resistors coupled between the output node of the differential amplifier and ground, the second node coupled to the second input node of the differential amplifier;

an input buffer circuit having an input node, a reference node and an output node, the input buffer generating an output signal having a voltage level according to the voltage level of an input signal applied to the first input node relative to the voltage level of a reference signal applied to the reference node;

a first switch coupled to the first node of the series coupled resistors and the reference node and having a control node coupled to the output of the input buffer, the first switch coupling the first node and the reference node together in response to an output signal having a voltage level less than the standard reference signal; and a second switch coupled to the third node of the series coupled resistors and the reference node and having a control node coupled to the output of the input buffer, the second switch coupling the third node and the reference node together in response to an output signal having a voltage level greater than the standard reference signal.

27. The memory device of claim 26 wherein the first switch of the input stage comprises a first transfer gate and the second switch of the input stage comprises a second transfer gate.

28. The memory device of claim 26 wherein the first and second switches of the input stage are included in a multiplexer.

29. The memory device of claim 26 wherein the input stage further comprises:

a first capacitor having a first node coupled to the first node of the series coupled resistors and a second node to which the standard reference signal is applied; and a second capacitor having a first node coupled to the third node of the series coupled resistors and a second node coupled to the second node of the first capacitor.

30. The memory device of claim 26 wherein the input buffer of the input stage comprises a SSTL input buffer.

31. A computer system, comprising:

a data input device;

a data output device;

a processor coupled to the data input and output devices; and a memory device coupled to the processor, the memory device comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage for providing an output signal having a logic value based on the voltage of an input signal, the input stage comprising:

an input buffer having an input terminal to which the input signal is applied, an output terminal at which the output signal is provided, and a reference terminal to which a reference voltage signal is applied, the input buffer generating an output signal having a logic value based on the voltage of the input signal relative to the voltage of the reference voltage signal;

an operational amplifier having a first input at which an initial reference voltage is applied, a second input, and an output;

a voltage divider circuit coupled between the output of the operational amplifier and a reference voltage supply, the voltage divider circuit having a first node at which a high reference voltage is provided, a second node coupled to the second input of the operational amplifier, and a third node at which a low reference voltage is provided; and first and second transfer gates coupled to the first and second nodes of the voltage divider, respectively, each transfer gate having control terminals to which the output of the input buffer is coupled, the first transfer gate coupling the high reference voltage signal to the reference terminal in response to the output signal of the input buffer having a low logic value and the second transfer gate coupling the low reference voltage signal to the reference terminal in response to the output signal of the input buffer having a high logic value.

32. A computer system, comprising:

a data input device;

a data output device;

a processor coupled to the data input and output devices; and a memory device coupled to the processor, the memory device comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage including an SSTL input buffer having input signal terminal, an output terminal and a reference voltage terminal, the input stage comprising:

an amplifier having an input to which a initial reference voltage signal is applied and further having first and second output terminals, the amplifier generating from the initial reference voltage signal a high reference voltage signal at the first output terminal and a low reference voltage signal at the second output terminal; and a selection circuit having first and second input terminals coupled to the first and second output terminals of the amplifier, respectively, an output terminal coupled to the reference voltage terminal, and a control terminal coupled to the output terminal of the input buffer, the selection circuit selectively coupling the first and second input terminals to the output terminal based on a logic value of an output signal of the input buffer to provide either the high or low reference voltage signals to the input buffer as the reference voltage signal.

33. A computer system, comprising:

a data input device;

a data output device;

a processor coupled to the data input and output devices; and a memory device coupled to the processor, the memory device comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage for generating an output signal having a voltage level according to the voltage level of an input signal relative to a reference voltage level, the input stage comprising:

an input buffer circuit having an input node at which the input signal is applied, a reference node at which a reference voltage signal having the reference voltage level is applied, and an output node at which the output signal is provided;

an amplifier circuit having an input node to which a standard reference voltage signal is applied, a first output node at which a first reference voltage signal generated by the amplifier circuit and having a first voltage level greater than the standard reference voltage signal is provided, and further having a second output node at which a second reference voltage signal generated by the amplifier circuit and having a second voltage level less than the standard reference voltage signal is provided; and a multiplexer having a selection terminal coupled to the output node of the input buffer, an output coupled to the reference node, and first and second input terminals coupled to the first and second output nodes of the amplifier, respectively, the multiplexer coupling the first reference voltage signal to the reference node in response to the output signal of the input buffer having a low logic level and coupling the second reference voltage signal to the reference node in response to the output signal of the input buffer having a high logic level.

34. A computer system, comprising:

a data input device;

a data output device;

a processor coupled to the data input and output devices; and a memory device coupled to the processor, the memory device comprising:

an address bus;

a control bus;

a data bus;

an address decoder coupled to the address bus;

a read/write circuit coupled to the data bus;

a memory-cell array coupled to the address decoder, control circuit, and read/write circuit; and an input stage, comprising:

a differential amplifier having first and second input nodes and an output node, a standard reference signal having a standard reference voltage applied to the first input node;

first, second, third, and fourth series coupled resistors having a first node between the first and second resistors, a second node between the second and third resistors and a third node between the third and fourth resistors, the series coupled resistors coupled between the output node of the differential amplifier and ground, the second node coupled to the second input node of the differential amplifier;

an input buffer circuit having an input node, a reference node and an output node, the input buffer generating an output signal having a voltage level according to the voltage level of an input signal applied to the first input node relative to the voltage level of a reference signal applied to the reference node;

a first switch coupled to the first node of the series coupled resistors and the reference node and having a control node coupled to the output of the input buffer, the first switch coupling the first node and the reference node together in response to an output signal having a voltage level less than the standard reference signal; and a second switch coupled to the third node of the series coupled resistors and the reference node and having a control node coupled to the output of the input buffer, the second switch coupling the third node and the reference node together in response to an output signal having a voltage level greater than the standard reference signal.

* * * * *